(12) United States Patent
Suh (10) Patent No.: US 7,224,067 B2
(45) Date of Patent: May 29, 2007

(54) INTERMETALLIC SOLDER WITH LOW MELTING POINT

(75) Inventor: Daewoong Suh, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/229,184

(22) Filed: Sep. 15, 2005

(65) Prior Publication Data

US 2007/0080451 A1    Apr. 12, 2007

(51) Int. Cl.
*H01L 23/48* (2006.01)
(52) U.S. Cl. .................. 257/772; 228/180.5; 228/56.3
(58) Field of Classification Search ............. 228/180.5, 228/56.3; 257/772
See application file for complete search history.

(56) References Cited

U.S. PATENT DOCUMENTS

| | | | | |
|---|---|---|---|---|
| 6,063,213 | A * | 5/2000 | Ogasa | 148/430 |
| 6,319,617 | B1 * | 11/2001 | Jin et al. | 428/469 |
| 2002/0078559 | A1 * | 6/2002 | Buchwalter et al. | 29/832 |
| 2002/0155661 | A1 * | 10/2002 | Massingill et al. | 438/244 |
| 2003/0168130 | A1 * | 9/2003 | Shohji | 148/403 |
| 2004/0112478 | A1 * | 6/2004 | Bieler et al. | 148/538 |

OTHER PUBLICATIONS

Chowhan, Kishan Singh A Study of Lead -Free Soldering and Assembly for RoHS Compliance, TechOnLine Published Apr. 12, 2005 http://www.techonline.com/community/ed_resource?feature_article/37904?print.*
Daewoong Suh, "Soldering an Electronics Package to a Motherboard", U.S. Appl. No. 10/808,192, filed Mar. 24, 2004.
Chad A. Kumaus et al., "Reactive Gettering in Phase Change Solders to Inhibit Oxidation at Contact Surfaces", U.S. Appl. No. 10/954,646, filed Sep. 29, 2004.
Ai Ling Low, "Substrate Grooves to Reduce Underfill Fillet Bridging", U.S. Appl. No. 10/954,959, filed Sep. 29, 2004.
Daewoong Suh, "Solders with Intermetallic Phases, Solder Bumps Made Thereof, Packages Containing Same, and Methods of Assembling Packages Therewith", U.S. Appl. No. 11/173,224, filed Jun. 30, 2005.
Daewoong Suh, "Bulk Metallic Glass Solder Material", U.S. Appl. No. 11/203,546, filed Aug. 12, 2005.

* cited by examiner

*Primary Examiner*—Leonardo Andujar
*Assistant Examiner*—Krista Soderholm
(74) *Attorney, Agent, or Firm*—Laleh Jalali (57) ABSTRACT

Embodiments of the invention provide a low-melting temperature comprised primarily of a bulk intermetallic phase material. This solder may allow reflow with less of a chance to damage microelectronic devices due to coefficient of thermal expansion mismatches, and may be creep resistant even at high homologous temperatures.

17 Claims, 5 Drawing Sheets

INTERMETALLIC SOLDER WITH LOW MELTING POINT

BACKGROUND

Background of the Invention

Many microelectronic devices use solder to make electrical and/or mechanical connections with other electrical components. For example, a microprocessor die may be connected to a packaging substrate with solder balls. As another example, a packaging substrate may be connected to a printed circuit board with solder balls, as by a ball grid array (BGA).

DETAILED DESCRIPTION

In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 1:
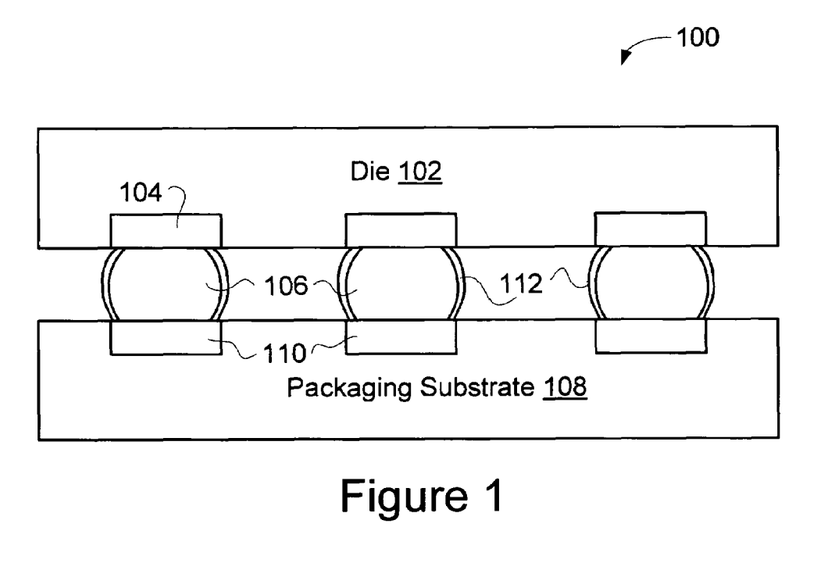
FIG. 1 is a cross sectional side view that illustrates a semiconductor device 100 according to one embodiment of the present invention.

FIG. 1 is a cross sectional side view that illustrates a semiconductor device 100 according to one embodiment of the present invention. In the embodiment shown in FIG. 1, the device 100 includes a microprocessor die 102 connected to a packaging substrate 108 by solder balls 106, although in other embodiments the solder 106 may couple different types of components. Each of the die 102 and substrate 108 may have solder pads 104, 110, which may contact the solder 106 and allow the solder 106 to couple the die 102 and substrate 108 together. While the solder 106 may be referred to as solder "balls" 106, the solder 106 coupling components together as discussed herein may take any form. Further, the solder 106 may make an electrical connection between components, a mechanical connection, or both.

In an embodiment, the solder 106 may have a low melting point. This may avoid high temperatures when reflowing the solder 106 to form solder balls 106 or to make a connection between components, such as components 102, 108. High temperatures used during solder reflow may cause device failure due to coefficient of thermal expansion (CTE) mismatches. Such failures caused by CTE mismatches may be exacerbated as solder connection may occur at temperatures above the melting point of the solder used. Thus, by using a low melting temperature solder 106, device failures may be avoided. In an embodiment, the melting temperature of the solder 106 may be less than about 130 degrees Celsius. In another embodiment, the melting temperature of the solder 106 may be about 110 degrees Celsius or less. In yet another embodiment, the melting temperature of the solder 106 may be between about 100 degrees Celsius and about 130 degrees Celsius. In other embodiments, the solder 106 may have a different melting temperature.

In an embodiment, the melting point of the solder 106 may be above the operating temperature of the components with which the solder 106 is used. For example, a microprocessor die 102 may operate between about 60 and 80 degrees Celsius. A solder 106 with a melting point above the operating temperature may thus avoid the solder 106 melting during device operation, causing a device failure.

In an embodiment, the solder 106 may be highly creep resistant when at a high homologous temperature. When a solder 106 has a low melting point, it may be at a high homologous temperature during operation of the device; the device's operating temperature may approach the melting temperature of the solder 106. A homologous temperature is the ratio of the actual temperature to the melting temperature, measured using an absolute temperature scale, such as the Kelvin temperature scale. If a solder material were susceptible to creep at high homologous temperatures, and that solder had a low melting point so under device operation conditions that solder were at a high homologous temperature, such as a homologous temperature of above 0.75, a homologous temperature of above 0.85, a homologous temperature of above 0.90, or even a homologous temperature of above 0.95, plastic deformation of the solder connection may occur. Such plastic deformation may result in the solder no longer connecting devices after relatively few operation cycles (a cycle being the device in operation and coming to operating temperature and then halting of the operation of the device to return it to room temperature), such as within 1000 cycles, or even within 500 cycles. Thus, a solder 106 that is creep resistant may reduce device failures.

In an embodiment, the solder 106 may include a bulk intermetallic compound (IMC) (also referred to as a bulk intermetallic phase) material that includes a first element and a second element as part of the intermetallic phase. An IMC is a chemically ordered alloy phase between two or more metallic elements where each element occupies specific sites in the crystal lattice of the material. This bulk IMC material may be one or more intermetallic phase(s) that makes up the majority of the solder 106. In an embodiment, the solder 106 may comprise at least 50% bulk IMC material, with the remainder of the solder being one or more additional material(s). In another embodiment, the solder 106 may comprise at least 80% bulk IMC material. In another embodiment, the solder 106 may comprise at least 90% bulk IMC material. In another embodiment, the solder 106 may comprise at least 95% bulk IMC material. In another embodiment, the solder 106 may comprise at least 98% bulk IMC material. In an embodiment, the solder 106 may be at least 99% bulk intermetallic phase material, with 1% or less other materials. In yet another embodiment, the solder 106 may be substantially entirely intermetallic compounds, although there may be more than one type of intermetallic compound that make up such a solder 106.

As IMC materials have an ordered crystalline structure, they may be resistant to creep and retain their strength even at high homologous temperatures. In an embodiment, the IMC material in the solder 106 may retain at least 80% of its yield strength and tensile strength at a homologous temperature of 0.80. In contrast, alloys that are not IMC materials, such as traditional solders, may undergo plastic deformation through creep at relatively low homologous temperatures. Thus, if a non-IMC solder has a low melting point and has a high homologous temperature during device operation, there may be plastic deformation due to creep, which may result in failure of the connection. Solder 106 that has a large proportion of IMC material may avoid such creep failure.

IMC materials may also be resistant to diffusion. This may contribute to good electromigration resistance and further improve the reliability of components, such as die 102 and packaging substrate 108, connected with solder 106 that includes IMC material.

As stated above, the solder 106 may include a bulk IMC material that includes a first element and a second element as part of the intermetallic phase material. For example, in an embodiment, the first element of the bulk IMC may be bismuth (Bi) and the second element may be indium (In). In an embodiment, the bulk intermetallic phase may include between about 30 weight percentage and about 40 weight percentage indium and about 70 weight percentage and about 60 weight percentage bismuth. In another embodiment, the bulk intermetallic phase may include between about 33 weight percentage and about 37 weight percentage indium and about 67 weight percentage and about 63 weight percentage bismuth. In another embodiment, the bulk intermetallic phase may include about 35 weight percentage indium and about 65 weight percentage bismuth. In other embodiments, the bulk intermetallic phase may include other elements in other ratios.

The Bi and In in the solder, or other elements comprising the bulk IMC material, may be substantially entirely in an intermetallic phase and part of the bulk IMC material in an embodiment. In other embodiments, there may be excess Bi or In (or other elements that comprise the bulk IMC material) within the solder 106 but not in the form of an intermetallic compound and not part of the bulk IMC material.

In one embodiment, the solder 106 may consist substantially entirely of the bulk IMC, such as the BiIn bulk IMC discussed above. In another embodiment, there may be additional materials in the solder 106. For example, there may be other non-intermetallic phase materials, other intermetallic phase materials, dopants, or other materials.

In some embodiments, the material of the solder 106 may include a "wetting dopant" to improve the solder's 106 ability to wet the solder pads 104, 110. In some embodiments, the solder 106 may comprise less than 1% by weight of the wetting dopant, although in other embodiments the solder 106 may include more. In some embodiments, the solder 106 may comprise between about 0.05% and about 0.2% by weight of the wetting dopant. In yet another embodiment, the solder 106 may comprise about 0.1% by weight of the wetting dopant. The wetting dopant may be a single element or may be multiple materials. The wetting dopant may be a second intermetallic phase material. Within the solder 106 before reflow, the wetting dopant may be present as islands within the bulk IMC material, at boundaries between grains of the bulk IMC material, or elsewhere.

The material chosen as a wetting dopant may be selected based on its ability to react with the material of the solder pads 104, 110. For example, in an embodiment where the solder pads 104, 110 comprise copper, zinc (Zn) may be added to the solder 106 as a wetting dopant. The zinc may form an intermetallic compound with the copper of the solder pads 104, 110 and/or help the bulk IMC to wet the solder pad 104, 110 and form a strong contact between the solder 106 and the pads 104, 110. After reflow, the wetting dopant may form an intermetallic compound with the material of the solder pad 104, 110 in some embodiments. A thin layer of such an intermetallic compound may be present at the interface between the solder 106 and the solder pad 104, 110 after reflow in some embodiments. Other materials that may be used as a wetting dopant include Ti, Zr, Li, rare earth elements (such as La, Ce, Lu and others) and other materials. In some embodiments, the solder 106 may lack this wetting dopant.

In some embodiments, the material of the solder 106 may include a "ductility dopant" to improve the solder's 106 ductility, as some IMC material may be brittle. In some embodiments, the solder 106 may comprise less than 1 atomic % of the ductility dopant, although in other embodiments the solder 106 may include more. In some embodiments, the solder 106 may comprise between about 0.01% and about 0.2 atomic % of the ductility dopant. In some embodiments, the solder 106 may comprise between about 0.02% and about 0.1 atomic % of the ductility dopant. In yet another embodiment, the solder 106 may comprise about 0.1 atomic % of the ductility dopant. The ductility dopant may be a single element or may be multiple materials.

The material chosen as a ductility dopant may be selected based on its ability to improve the ductility of the bulk IMC material. For example, in an embodiment where the bulk IMC material comprises BiIn, boron (B) may be added to the bulk IMC material of the solder 106 as a ductility dopant. In some embodiments, adding the ductility dopant may double the fracture toughness of the bulk IMC material of the solder 106. Other materials may be used as a ductility dopant. In some embodiments, the solder 106 may lack this ductility dopant.

In some embodiments, the solder 106 that connects components, such as die 102 and packaging substrate 106, may have a thin coating layer 112, although other embodiments may lack this coating 112. In an embodiment, the solder 106 may be formed and/or reflowed in a vacuum or other environment substantially free of hydrogen. After formation of the solder 106 structures that connect components, the solder 106 may be annealed to form the thin coating layer 112, such as heating the solder 106 to a temperature near but below the solder's 106 melting temperature for five minutes, although other times may be used. This thin coating layer 112 may comprise an oxide, such as an oxide of one of the metals in the solder 106. Other suitable methods for forming this coating layer 112 may also be used. This thin coating layer 112 may act as a protective layer to prevent reaction of the material of the solder 106 with environmental materials, which may cause the bulk IMC material of the solder 106 to have decreased ductility.

Figure 2:
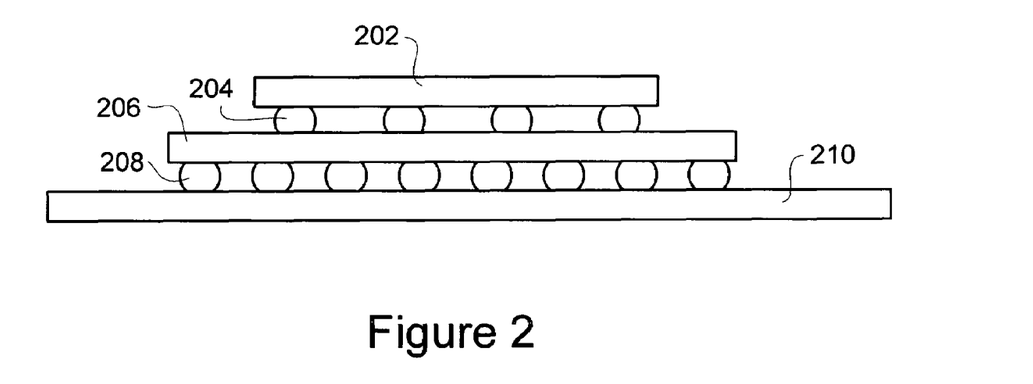
FIG. 2 is a cross sectional side view that illustrates multiple components that may be coupled by solder that may include bulk intermetallic phase material.

FIG. 2 is a cross sectional side view that illustrates multiple components that may be coupled by solder 106 that may include bulk intermetallic phase material. In an embodiment, there may be a first component 202 that may be a die, a second component 206 that may be a package substrate, and a third component 210 that may be a circuit board, although in other embodiments there may be different types of components 202, 206, 210. Conductive material 204 may connect the first component 202 to the second component 206, and conductive material 208 may connect the second component 206 to the third component 210. One or both of the sets of conductive material 204, 208 may be the solder 106 with bulk IMC material in some embodiments. There may be underfill material (not shown) between components 202 and 204 and/or between components 206 and 208 in some embodiments, although other embodiments may lack such underfill material.

Figure 3A:
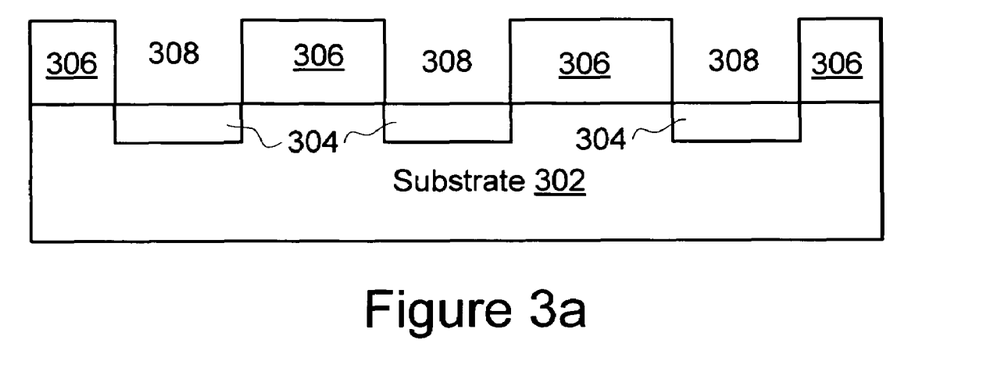
FIGS. 3a through 3d are cross sections of a microelectronic device during solder processing and reflow according to an embodiment.

FIG. 3a is a cross section of a microelectronic device during processing according to an embodiment. A substrate 302, which may be, for example, a die, may include one or more solder pads 304 (which also may be referred to as bond pads 304) for electrical communication between the substrate 302 and other components. The microelectronic device is depicted as being processed with a patterned mask 306 that has trenches 308 formed to expose the bond pads 304. In an embodiment, the bond pad 304 is a copper upper metallization that can touch any one of several metallization layers. For example, a metallization such as metal one (M1, not pictured) in a simple microelectronic device makes electrical contact with the bond pad 304. In another example, a metallization such as metal two (M2, not pictured) makes electrical contact with the bond pad 304. The M2 makes electrical contact with the M1. This scheme can be continued up to and including M7 and higher if present. By this disclosure, it becomes clear that various semiconductor substrate structures are applicable to the various embodiments.

Figure 3B:
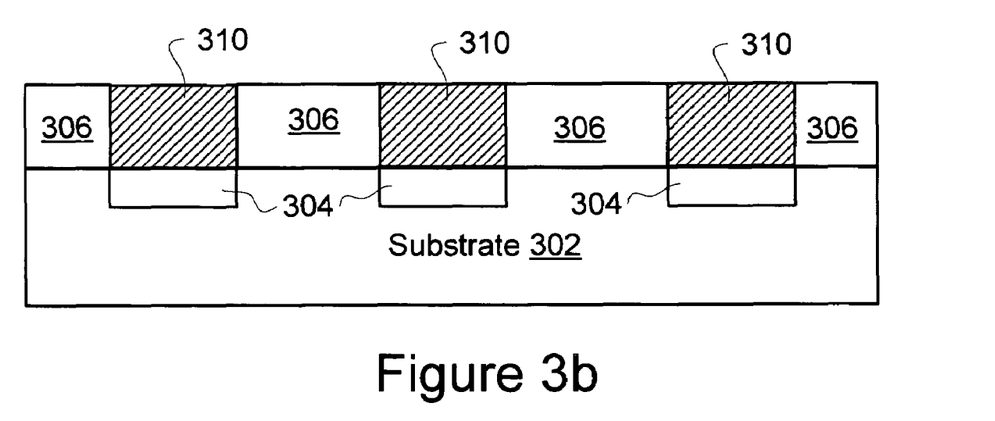

FIG. 3b is a cross section of the microelectronic device depicted in FIG. 3a after further processing. The patterned mask 306, which in an embodiment is a patterned photoresist, has been filled with a solder precursor, also referred to as a solder paste 310, according to the various embodiments set forth in this disclosure. In an embodiment, the solder paste 310 may include a flux vehicle such as an evaporative binder for the solder paste 310 during processing. The solder paste 310 may also include solder 106, including the bulk intermetallic compound material.

Figure 3C:
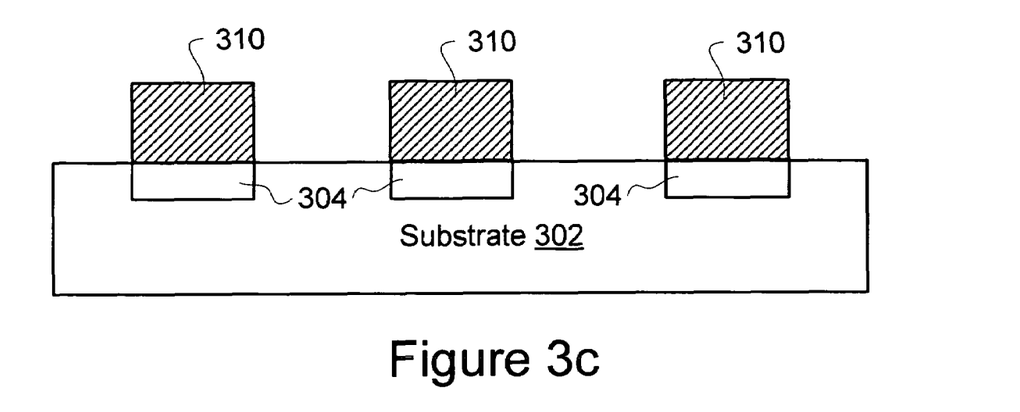

FIG. 3c is a cross section of the microelectronic device depicted in FIG. 3b after further processing. In this embodiment, the patterned mask 306 has been removed. Removal of the patterned mask 306 can be done by simply pulling it away from the substrate 302, and thereby leaving the solder paste 310 which is formed as discrete islands directly above the bond pads 304.

Figure 4:
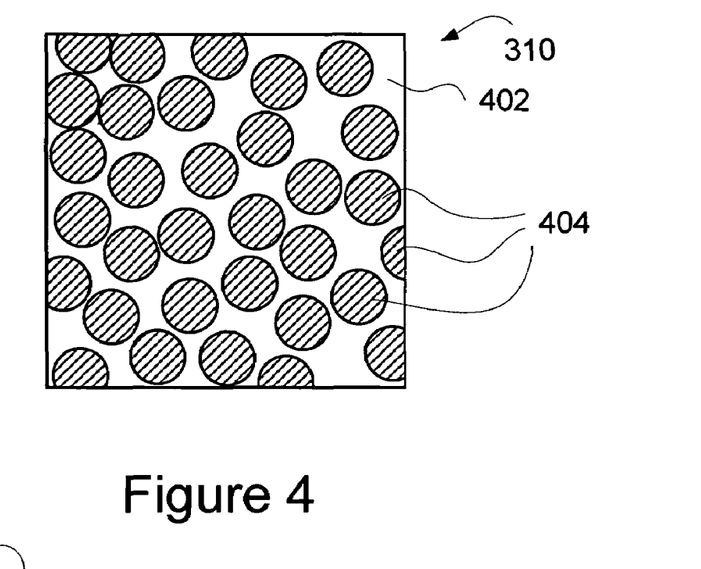
FIG. 4 is an enlargement of a portion of one of the discrete islands of solder paste illustrated in FIG. 3c.

FIG. 4 is an enlargement of a portion of one of the discrete islands of solder paste 310 illustrated in FIG. 3c. FIG. 4 depicts the solder paste 310, which includes a solder precursor as a solder powder 404 (which may be solder 106 in powder form) within a flux matrix 402. The solder powder 404 includes the bulk IMC material described above with respect to solder 106 and possibly additional material(s) described with respect to solder 106. Because the flux matrix 402 may substantially protect the solder powder 404 from corrosive and/or oxidative influences, the solder powder 404 can remain substantially oxidation-resistant during reflow. In an embodiment, the solder powder 404 may have a diameter in a range from about 4 microns to about 1,000 microns.

Figure 3D:
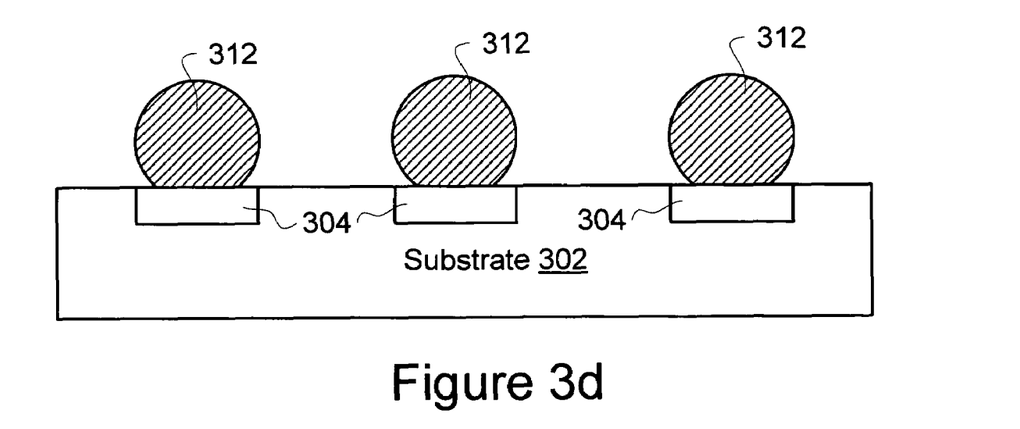

FIG. 3d is a cross section of the microelectronic device depicted in FIG. 3c after further processing. A reflow process has been commenced, during which the flux matrix 402 (as illustrated in FIG. 4) has been volatilized, and the solder powder 404 has reflowed into a solder bump 312. The solder bump 312 may be the solder 106 described above. The reflow process depicted for the microelectronic device can precede a method of assembling a microelectronic device package, it can be simultaneous to other heat treatments of a microelectronic device package, or it can follow some elements of assembling a microelectronic device package.

In an embodiment, the solder 106 of the solder bump 312 may comprise a BiIn bulk IMC material as described above. For example, in an embodiment the solder 106 may include greater than about 98% bulk IMC material, with the bulk IMC material having about 35% by weight In, about 65% by weight Bi. The remaining material of the solder may be a wetting dopant and/or a ductility dopant, with each of these included components being less than about 1% of the solder 106. Such a solder 106 with a BiIn bulk IMC may have a melting temperature of about 110 degrees Celsius. The reflow of the solder paste 310 to form the solder bump 312 may occur at a temperature above the melting temperature of the solder material, such as about 1 to 14 degrees Celsius higher than the melting temperature, although other temperatures may be used. In an embodiment where the bulk IMC material is BiIn, the reflow may occur at a temperature less than about 130 degrees Celsius. The low melting temperature may avoid damage to the substrate 302 that may otherwise be caused by CTE mismatches and a different solder type that may require a high melting point, even if the solder 106 is reflowed at a temperature above its melting point.

During reflow, one or more of the elements in the bulk IMC material of the solder 106 may form an IMC with material of the solder pad 304. For example, if the solder 106 includes a BiIn bulk IMC material and the solder pad 304 comprises Ni or Cu, the In of the bulk IMC material may form a second IMC material with the Ni or Cu of the solder pad 304. Similarly, if the solder 106 of the solder paste 310 contains a wetting dopant, the wetting dopant may react with the material of the solder pad 304. This reaction may result in yet another intermetallic phase material in the solder bumps 312 in some embodiments.

Figure 5:
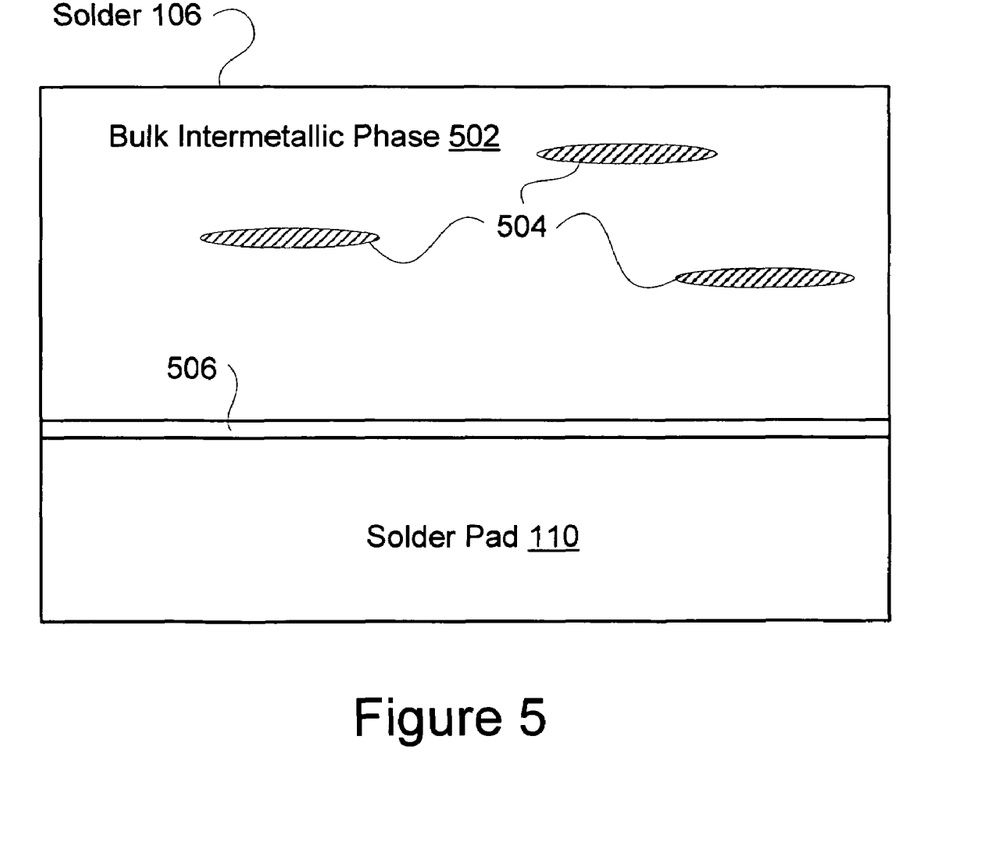
FIG. 5 is a close-up cross sectional side view that illustrates the solder material of the solder bump in more detail, according to an embodiment that includes a wetting dopant.

FIG. 5 is a close-up cross sectional side view that illustrates the solder 106 material of the solder bump 312 in more detail, according to an embodiment that includes a wetting dopant. In an embodiment, the majority of the solder 106 may be the bulk intermetallic phase material 502, such as BiIn. The solder 106 may have included less than about 1% Zn, or another wetting dopant 504. The wetting dopant 504 may be present in small islands within the bulk intermetallic phase material 502 or at the grain boundaries in some embodiments. This wetting dopant may cause enhanced wetting upon the solder pad 110 when the solder 106 is heated above its melting temperature. During reflow, some of the wetting dopant may react with the material of the solder pad 110 and form another IMC. This second IMC may be in a thin layer 506 at the interface between the solder 106 and solder pad 110. While this thin layer 506 is shown as continuous in FIG. 5, it may be discontinuous in some embodiments so that there are multiple thin layers 506 between the solder 106 and solder pad 110, and other embodiments may lack this thin layer 506. In some embodiments, much of the wetting dopant 504 may migrate to the interface between the solder 106 and solder pad 110 and may react with the solder pad 110 material during reflow, while in other embodiments, substantial portions of the wetting dopant 504 may remain as small islands in the bulk IMC 502 or at grain boundaries.

Figure 6:
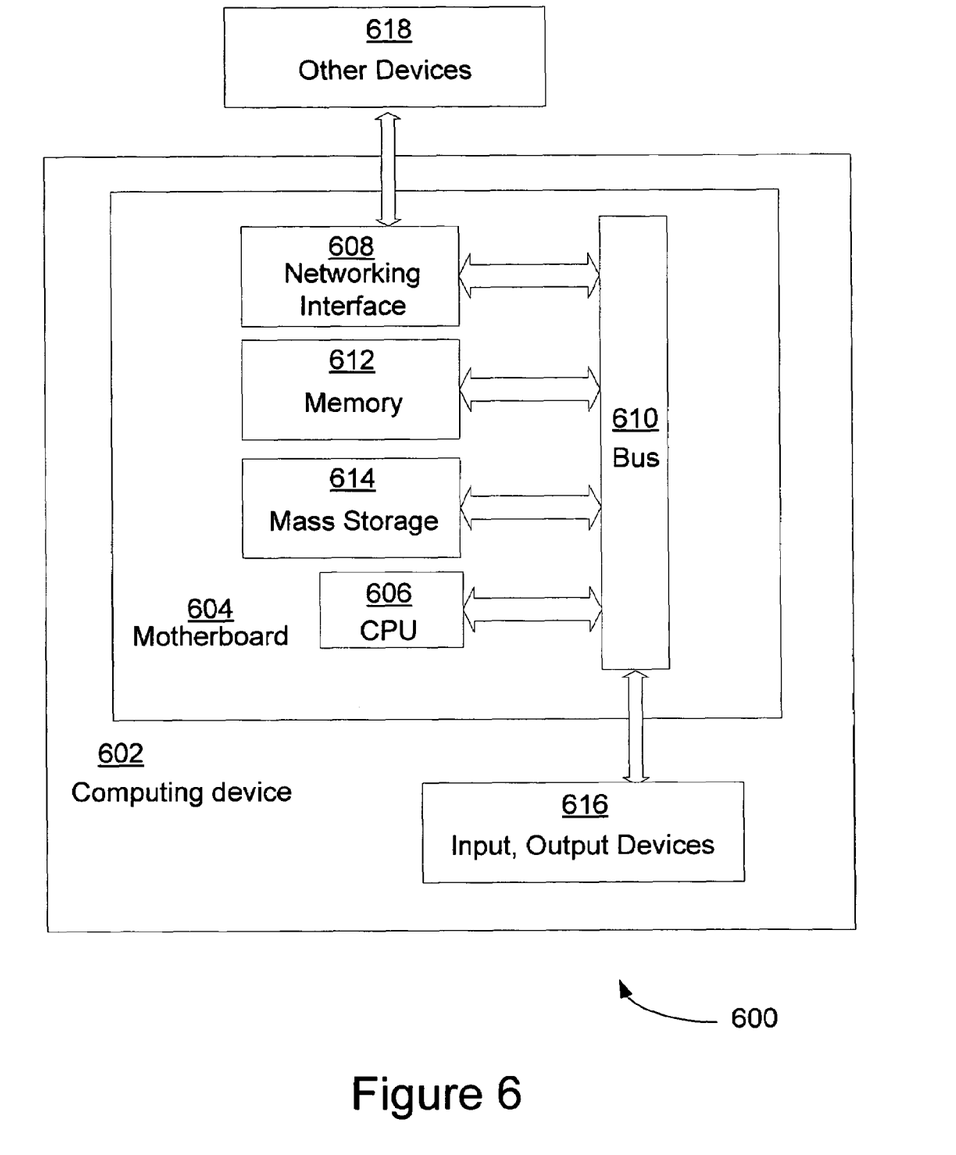
FIG. 6 illustrates a system in accordance with one embodiment of the present invention

FIG. 6 illustrates a system 600 in accordance with one embodiment of the present invention. One or more devices 100 formed and connected to another component by solder 106 with bulk intermetallic phase material as described above may be included in the system 600 of FIG. 6. As illustrated, for the embodiment, system 600 includes a computing device 602 for processing data. Computing device 602 may include a motherboard 604. Coupled to or part of the motherboard 604 may be in particular a processor 606, and a networking interface 608 coupled to a bus 610. A chipset may form part or all of the bus 610. The processor 606, chipset, and/or other parts of the system 600 may be connected to other components by solder 106 with bulk intermetallic phase material as described above.

Depending on the applications, system 600 may include other components, including but are not limited to volatile and non-volatile memory 612, a graphics processor (integrated with the motherboard 604 or connected to the motherboard as a separate removable component such as an AGP or PCI-E graphics processor), a digital signal processor, a crypto processor, mass storage 614 (such as hard disk, compact disk (CD), digital versatile disk (DVD) and so forth), input and/or output devices 616, and so forth.

In various embodiments, system 600 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

I claim:

1. A device, comprising:
    a solder pad comprising a first element; and
    solder on the solder pad, the solder including a bulk intermetallic phase, wherein at least 80% weight percentage of the solder consists of the bulk intermetallic phase, the solder further comprising less than one percent by weight of a first dopant selected from the list consisting of Zn, Li, Ti, Zr and rare earth elements and less than one percent by weight of a second dopant, the second dopant being boron.

2. The device of claim 1, further comprising an oxide layer on the solder.

3. The device of claim 1, wherein the solder pad is part of a packaging substrate, further comprising a die, the solder coupling the die to the packaging substrate.

4. The device of claim 1, wherein the solder pad is part of a packaging substrate, further comprising a circuit board, the solder coupling the packaging substrate to the circuit board.

5. The device of claim 1, wherein the bulk intermetallic phase consists of between about 33 and 37 weight percentage indium and between about 63 and 67 weight percentage bismuth.

6. The device of claim 5, wherein the solder has a melting point between about 100 degrees celsius and about 130 degrees celsius.

7. A method, comprising:
    placing solder upon a substrate for bonding;
    bonding the substrate to another structure with the solder, the bonding including heating the solder;
    wherein prior to heating the solder to bond the substrate to another structure, the solder includes:
        a bulk intermetallic phase material, wherein at least 80% weight percentage of the solder consists of the bulk intermetallic phase material, and wherein the bulk intermetallic phase material has a melting point less than about 130 degrees celsius;
    wherein heating the solder comprises heating the solder above the melting point of the bulk intermetallic phase material;
    allowing the solder to cool so the bulk intermetallic phase material resolidifies to couple the substrate to a second circuitry component; and
    annealing the solder to form a layer of oxide on the solder, after allowing the solder to cool.

8. The method of claim 7, wherein the substrate is a packaging substrate, further comprising contacting the solder with a die, before heating the solder.

9. The method of claim 7, wherein the bulk intermetallic phase material consists of about 35 weight percentage indium and about 65 weight percentage bismuth.

10. The method of claim 9, wherein the solder further comprises less than one percent by weight of a dopant selected from the list consisting of Zn, Li, Ti, Zr and rare earth elements.

11. A solder composition comprising:
   a first element;
   a second element;
   wherein at least 80% of the solder composition consists of an intermetallic phase material that includes the first and second elements;
   less than one percent by weight of a first dopant selected from the list consisting of Zn, Li, Ti, Zr and rare earth elements; and
   less than one percent by weight of a second dopant, the second dopant being boron.

12. The solder composition of claim 11, wherein the first element is bismuth.

13. The solder composition of claim 12, wherein the second element is indium.

14. The solder composition of claim 13, wherein between about 30 weight percentage and about 40 weight percentage of the intermetallic phase material is indium and between about 70 weight percentage and about 60 weight percentage of the intermetallic phase material is bismuth.

15. The solder composition of claim 13, wherein between about 33 weight percentage and about 37 weight percentage of the intermetallic phase material is indium and between about 67 weight percentage and about 63 weight percentage of the intermetallic phase material is bismuth.

16. The solder composition of claim 13, wherein the intermetallic phase material consists of about 35 weight percentage indium and about 65 weight percentage bismuth.

17. The solder composition of claim 11, wherein the solder composition has a melting point between about 100 degrees celsius and about 130 degrees celsius.

* * * * *